US009755101B2

(12) United States Patent
Gresty et al.

(10) Patent No.: US 9,755,101 B2
(45) Date of Patent: *Sep. 5, 2017

(54) GROUP 13 SELENIDE NANOPARTICLES

(71) Applicant: Nanoco Technologies, Ltd., Manchester (GB)

(72) Inventors: Nathalie Gresty, Chester (GB); Ombretta Masala, Manchester (GB); Christopher Newman, West Yorkshire (GB); Stephen Whitelegg, Cheshire (GB); Nigel Pickett, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/099,282

(22) Filed: Apr. 14, 2016

(65) Prior Publication Data
US 2016/0233373 A1   Aug. 11, 2016

Related U.S. Application Data

(63) Continuation of application No. 13/935,942, filed on Jul. 5, 2013, now Pat. No. 9,359,202.

(60) Provisional application No. 61/669,339, filed on Jul. 9, 2012.

(51) Int. Cl.
| | |
|---|---|
| *B82Y 40/00* | (2011.01) |
| *H01L 31/18* | (2006.01) |
| *C01B 19/00* | (2006.01) |
| *H01L 21/02* | (2006.01) |
| *H01L 31/032* | (2006.01) |
| *H01L 31/0352* | (2006.01) |
| *B82Y 30/00* | (2011.01) |
| *C09D 11/52* | (2014.01) |
| *B82Y 20/00* | (2011.01) |

(52) U.S. Cl.
CPC ......... *H01L 31/1864* (2013.01); *B82Y 30/00* (2013.01); *C01B 19/007* (2013.01); *C09D 11/52* (2013.01); *H01L 21/02568* (2013.01); *H01L 21/02601* (2013.01); *H01L 21/02628* (2013.01); *H01L 31/0322* (2013.01); *H01L 31/035218* (2013.01); *B82Y 20/00* (2013.01); *B82Y 40/00* (2013.01); *C01P 2002/72* (2013.01); *C01P 2002/76* (2013.01); *C01P 2002/84* (2013.01); *C01P 2002/88* (2013.01); *C01P 2004/04* (2013.01); *C01P 2004/64* (2013.01); *Y02E 10/541* (2013.01); *Y02P 70/521* (2015.11)

(58) Field of Classification Search
CPC .......... H01L 31/1864; H01L 31/0322
USPC ......... 423/509; 438/95; 556/1, 110; 977/774
See application file for complete search history.

(56) References Cited

U.S. PATENT DOCUMENTS

| | | | |
|---|---|---|---|
| 8,563,348 B2 | 10/2013 | Harris et al. | |
| 9,359,202 B2 * | 6/2016 | Gresty | ............ C01B 19/007 |
| 2007/0054435 A1 | 3/2007 | Yoon | |
| 2009/0139574 A1 * | 6/2009 | Pickett | ............ B82Y 30/00 |
| | | | 136/265 |
| 2010/0319776 A1 | 12/2010 | Choe et al. | |

FOREIGN PATENT DOCUMENTS

| | | |
|---|---|---|
| JP | 2011-233700 | 11/2011 |
| WO | 2008129250 A2 | 10/2008 |
| WO | 2009068878 A2 | 6/2009 |
| WO | 2011066205 A1 | 6/2011 |
| WO | 2012075267 A1 | 6/2012 |

OTHER PUBLICATIONS

Stoll S. L et al. Selenide and Selenolate Compounds of Indium: A Comparative Study of In—Se Bond-Forming Reactions, Journal of the Chemical Society, Dalton Transactions, Chemical Society, Jan. 1, 1997, pp. 1315-1321, Letchworth, GB.
International Search Report for PCT/IB2013/002223 dated Feb. 13, 2014 (10 pages).
English translation of Chinese office action for Chinese patent application No. 201380036492.3, foreign equivalent of U.S. Appl. No. 15/099,282.
English translation of Japanese office action received in corresponding Japanese patent application No. 2015-521084.

\* cited by examiner

*Primary Examiner* — Pancham Bakshi
(74) *Attorney, Agent, or Firm* — Blank Rome LLP

(57) ABSTRACT

A method of preparing Group XIII selenide nanoparticles comprises reacting a Group XIII ion source with a selenol compound. The nanoparticles have an $M_xSe_y$ Semiconductor core (where M is In or Ga) and an organic capping ligand attached to the core via a carbon-selenium bond. The selenol provides a source of selenium for incorporation into the semiconductor core and also provides the organic capping ligand. The nanoparticles are particularly suitable for solution-based methods of preparing semiconductor films.

14 Claims, 9 Drawing Sheets

GROUP 13 SELENIDE NANOPARTICLES

RELATED APPLICATIONS

This application is a continuation of U.S. application Ser. No. 13/935,942 filed on Jul. 5, 2013, now U.S. Pat. No. 9,359,202, which is a non-provisional of, and claims priority to, U.S. Provisional Application Ser. No. 61/669,339, filed on Jul. 9, 2012, the contents of which are hereby incorporated by reference in their entireties.

BACKGROUND

Group XIII selenide materials are semiconductors with a wide variety of potential applications that include photovoltaic and data storage devices, nonlinear optics and photosensors such as p-n junction photodiodes, owing to their wide band gap ranges. The selenides exist in two oxidation states, namely, +2 MSe (M=Ga, In) and +3 $M_2Se_3$ (M=Al, Ga, In), offering a range of direct band gaps (1.4-2.5 eV for indium selenide: $\alpha$-$In_2Se_3$ 1.42 eV, $\beta$-$In_2Se_3$ 1.55 eV, $\gamma$-$In_2Se_3$ 2.00 eV; 1.8-2.6 eV for gallium selenide: $\alpha$-$Ga_2Se_3$ 2.2 eV, $\beta Ga_2Se_3$ 2.3 eV; 3.1 eV for $Al_2Se_3$).

Group XIII selenide materials can be used to fabricate photovoltaic devices, such as copper indium gallium diselenide/sulfide ("CIGS") solar cells. For commercial viability, photovoltaic cells must generate electricity at a cost that is competitive with fossil fuels. To meet these cost constraints, the photovoltaic cells must utilize low cost materials and device fabrication and must convert sunlight to electricity with high efficiency. Materials synthesis and device fabrication must also be commercially scalable.

For photovoltaic cells fabricated from thin films, the material cost is intrinsically low, since only a small amount of material is required to produce the active layer of up to a few microns. Thus, much development work has focused on producing high efficiency thin film solar cells. Chalcopyrite CIGS devices have demonstrated significant potential. The band gaps of $CuInS_2$ (1.5 eV) and $CuInSe_2$ (1.1 eV) match well to the solar spectrum, predisposing them to high conversion efficiency. Currently, efficiencies up to 20.3% have been achieved for $Cu(In,Ga)Se_2$.

Binary chalcogenide nanopowders, including copper selenide, and/or indium selenide, and/or gallium selenide, have been proposed as starting materials for CIGS solar cells. For example, U.S. Patent Publication No. US 2007/0092648 A1, entitled "Chalcogenide Solar Cells," describes Group IB-chalcogenide nanoparticles and/or Group IIIA-chalcogenide nanoparticles as a precursor material for forming a film of Group IB-IIIAchalcogenide compounds.

Fabrication of absorber layers for photovoltaic devices typically involves expensive vapor phase or evaporation techniques. Alternatively, nanoparticles can be melted or fused together to form a thin film, such that the nanoparticles coalesce to form large grains. For example, films of metal oxide nanoparticles can be reduced using $H_2$ and then selenized, usually with $H_2Se$. As described in co-owned PCT patent application published as WO 2009/068878 A2, incorporating a selenium source into the nanoparticles can obviate the costly selenization step, thereby obviating the need to use toxic $H_2Se$.

For nanoparticles to be viable as a starting material for photovoltaic thin films, they preferably possess a number of properties. Primarily, the nanoparticles must be small, preferably of a scale such that the physical, electronic and optical properties of the nanoparticles may differ from those properties of the bulk material. By restricting the electronic wave function to such small dimensions, a particle becomes "quantum confined," whereby its properties are intermediate between those of the bulk material and an individual atom. Such nanoparticles are termed "quantum dots." Smaller particles are able to closely pack, enabling them to coalesce more easily upon melting. Secondly, the nanoparticles are preferably of a narrow size distribution so that the particles all melt at approximately the same temperature. This property ensures that the resulting thin film is of high, even quality. Thirdly, the nanoparticle may be capped with a volatile organic capping ligand to help solubilize the nanoparticle in solution. But the capping ligand must be easily removed upon heating to avoid the detrimental incorporation of carbon into the film.

There are a number of techniques have been used to prepare indium selenide nanoparticles. Examples of the synthesis of gallium selenide nanoparticles are less well documented, and aluminum selenide nanoparticle synthesis does not appear to exist in the art. Nanoparticle syntheses include colloidal methods, single source precursor methods, sonochemical methods, metathesis in liquid ammonia, chemical vapor deposition, and thermal evaporation.

Typically, colloidal methods involve high temperature (>250° C.) syntheses, forming nanoparticles capped with trioctylphosphine (TOP), trioctylphosphine oxide (TOPO), phosphonic acids or amines. The resulting nanoparticles are small (<20 nm) and monodisperse, lowering their melting point with respect to that of the bulk material, thus enabling lower temperature device processing.

TOP- or TOPO-capped GaSe and InSe nanoparticles can be prepared colloidally using trimethylgallium ($GaMe_3$) and trimethylindium ($InMe_3$), respectively, as the metal sources. Tu, et al., describe a colloidal method for preparing GaSe and InSe nanoparticles (H. Tu et al., *Nano Lett.*, 2006, 6, 116). Se is dissolved in TOP (for TOP-capped nanoparticles) or a mixture of TOP and TOPO (for TOPO-capped nanoparticles). After heating to 280° C., a 1 M solution of trimethylgallium or trimethylindium in TOP is injected, then the nanoparticles are grown at 268° C. for a given time. The GaSe nanoparticles are grown to 2.7 nm in 18 minutes, while the growth time for 3 nm InSe nanoparticles is 50-90 minutes, depending on the reaction conditions.

Yang, et al. describes a similar method for producing InSe nanoparticles capped with TOP and/or TOPO or with hexyl phosphonic acid (S. Yang et al., *J. Phys. Chem. B*, 2005, 109, 12701). The particle sizes range from 2.9 nm to >80 nm depending on the reaction temperature and time. Luminescent GaSe nanoparticles with a photoluminescence quantum yield of about 10% can be made using a similar method, as described by Chikan, et al. (V. Chikan et al., *Nano Lett.*, 2002, 2, 141). TOP and TOPO are heated to 150° C. overnight. TOP/Se is added and the mixture is heated to 278° C. A solution of $GaMe_3$ in TOP is injected, causing the temperature to drop to 254° C. The solution is heated to 266-268° C. and held at that temperature for approximately two hours. Upon cooling, the nanoparticles can be isolated in air. The average particle size of the resulting GaSe nanoparticles is between 2-6 nm. The size distribution can be narrowed by size-selective precipitation or chromatographic purification to yield nanoparticles that emit with a photoluminescence maximum between 320-450 nm.

Single source precursor methods use a single source molecule containing the elements of the desired nanoparticles. The source molecule is thermally decomposed to form the nanoparticles. Single source precursor methods can be used to make indium selenide nanoparticles (N. Revaprasadu et al., *J. Mater. Chem.*, 1999, 9, 2885). TOPOand 4ethylpyridine-capped InSe nanoparticles having diameters of 5.8-7.0 nm have been synthesized using the single source precursor tris(diethyldiselenocarbamato)indium(III) ([In(Se$_2$CNEt$_2$)$_3$]). To prepare TOPO-capped nanoparticles, the [In(Se$_2$CNEt$_2$)$_3$] is dispersed in TOP, then injected into TOPO at 250° C. After an initial drop in temperature, the solution is held at 240° C. for 30 minutes. To synthesize 4-ethylpyridine-capped InSe, [In(Se$_2$CNEt$_2$)$_3$] is stirred for 1 hour at 100° C. in 4-ethylpyridine. The temperature is raised to 167° C. and the mixture is refluxed for 24 hours.

Sonochemical synthesis of nanoparticles involves the ultrasonication of precursor materials in a solvent. Bulk GaSe single crystals can be converted to nanoparticles by ultrasonication (K. Allakhverdiev et al., *Phys. Stat. Sol. (a)*, 1997, 163, 121). After sonicating the crystals in methanol for 60 minutes under ambient conditions, nanoparticles of <30 nm are obtained.

Liquid mediated metathesis reactions are those in which two chemical species exchange in the presence of a liquid medium, such as ammonia. Spherical Ga$_2$Se$_3$ and In$_2$Se$_3$ nanoparticles with diameters<50 nm can be generated by metathesis of Group XIII chlorides and Na$_2$Se in liquid ammonia (G. A. Shaw et al., *Inorg. Chem.*, 2001, 40, 6940). In a typical reaction, 2GaCl$_3$ or 2InCl$_3$ react stoichiometrically with 3Na$_2$Se in liquid ammonia to form an amorphous phase. The solid can be annealed at 250-300° C. for 2-36 hours to form a crystalline phase. The nanoparticles produced by this method typically form large aggregates, up to several microns in diameter.

Chemical vapor deposition (CVD) is used to make thin films of semiconductor materials. InSe and GaSe nanoparticles can be formed by CVD. InSe nanoparticles have been grown on KBr substrates at 290° C. in a static environment from the thermolysis of [(EtMe$_2$C)InSe]$_4$. The resulting nanoparticles have a spherical morphology and an average diameter of 88 nm. Similarly, using [($^t$Bu)GaSe]$_4$, GaSe nanoparticles with an average diameter of 42 nm can be grown at 335° C. under argon flow. The resulting nanoparticles have a pseudo-spherical structure described as a 'string of pearls' structure (S. Stoll et al., *Chem. Vap. Deposition*, 1996, 2, 182). Under these conditions, nanoparticle formation is typically complete within 20 minutes.

Thermal evaporation involves depositing a thin film of a material by evaporating a bulk source of the material under the flow of a carrier gas, which is then deposited on a substrate upon cooling. In$_2$Se$_3$ nanowires have been synthesized by thermal evaporation techniques, whereby bulk In$_2$Se$_3$ is loaded into a tube furnace under the flow of a carrier gas. The furnace contains a silicon substrate covered with a gold catalyst upon which nanoparticles are grown by ramping the temperature. For example, Li et al. describe the growth of indium selenide nanowires using an argon carrier gas and ramping the source to 940° C. and the substrate to 690° C., maintaining the temperature for 90 minutes (Y. Li et al., *J. Mater. Chem.*, 2011, 21, 6944). In$_2$Se$_3$ nanowires formed in 2% H$_2$ in N$_2$ gas at 60 mTorr at 700° C. have also been reported (H. Peng et al., *J. Am. Chem. Soc.*, 2007, 129, 34).

Methods of forming films of Group XIII selenide nanoparticles must be economically competitive if devices using such films are to be viable. Such methods include, but are not limited to, printing or spraying processes. The examples of Group XIII selenide synthesis described in the prior art are unfavorable for preparing materials for processing into thin films on a commercial scale because those prior art methods do not provide the essential features described above. Namely, the prior art does not provide a scalable reaction to generate Group XIII selenide nanoparticles with a low melting point, narrow size distribution and a volatile capping ligand. For instance, hot injection techniques produce materials in very low yields and are not easily scaled commercially. Other techniques like sonochemical synthesis and liquid metathesis do not allow a tight control over the physical properties of the nanomaterials, including particle size and monodispersity.

Solar cells that can be printed on flexible substrates represent an attractive costefficient alternative to the conventional vacuum-deposited solar cells because the materials can be deposited by using non-vacuum, solution-processable printing technologies. Thus there is a need for a simple, low-temperature technique for fabricating high-quality and uniform M-Se material (M=Ga, In) that can be easily dispersed into aqueous and organic media enabling fast and economic device manufacturing using solution-processable deposition techniques to meet the growing demand for low-cost solar cells on flexible substrates. In addition to their use in photovoltaic devices, Group XIII selenide nanoparticles may be attractive as an alternative to organic dyes used in optical information data storage applications.

SUMMARY

Methods of producing Group XIII selenide nanoparticles are described. As used herein, the term Group XIII selenide refers to a compound having the formula M$_x$Se$_y$, wherein M is Ga or In, 0<x, and 0<y. Also as used herein, the term nanoparticle(s) is not limited to particles of any particular shape and may include particles that are spherical, flat, elongated, scroll-like, etc. The method comprises reacting a Group XIII ion precursor with a selenol compound. The term selenol refers to a compound having the formula R—SeH, wherein R is an organic group.

Nanoparticles prepared according to the disclosed methods have an M$_x$Se$_y$ semiconductor core and an organic capping ligand. The selenol provides a source of selenium for incorporation into the semiconductor core and also provides the organic capping ligand. The organic group R is bound to the nanoparticle surface by a Se—C covalent bond. The nanoparticles are substantially free of non-Se chalcogenides, such as sulfur.

The disclosed nanoparticles are particularly suitable for solution-based methods of preparing semiconductor films. For example, the nanoparticles can be used to make films of CIGS materials by co-depositing the M$_x$Se$_y$ nanoparticles with CuSe nanoparticles and sintering the resulting film. The organic capping ligands enhance the solubility/dispersibility of the nanoparticles in an organic solvent, allowing the nanoparticles to be used in inks, pastes, and other formulations for depositing films of the nanoparticles. The selenol capping ligand provides a selenium-rich atmosphere during sintering. In some embodiments, the selenium derived from the capping ligand obviates the need to include a further selenization step, such as is typically required for maintaining a suitable amount of selenium in CIGS films during sintering. Such selenization steps are expensive and often involve the use of toxic materials, such as H$_2$Se gas.

The methods disclosed herein offer several advantages. The stoichiometry of the nanoparticles can be fine-tuned by altering the stoichiometry of the precursors added, providing a distinct advantage over single source precursor methods for which the stoichiometry is inherently determined by that of the precursor. The disclosed methods do not use pyrophoric organometallic precursors, such as InMe$_3$ and GaMe$_3$. Further, the reaction temperatures are significantly lower (e.g., <200° C.) than those described in the prior art for nanoparticle nucleation and growth. The reactions are conducted under a slight overpressure of nitrogen to eliminate any oxygen, but high pressures or vacuums are not required, offering an advantage over CVD and thermal evaporation techniques. Overall, the reaction provides a high yield and is commercially scalable.

DETAILED DESCRIPTION

Figure 1:
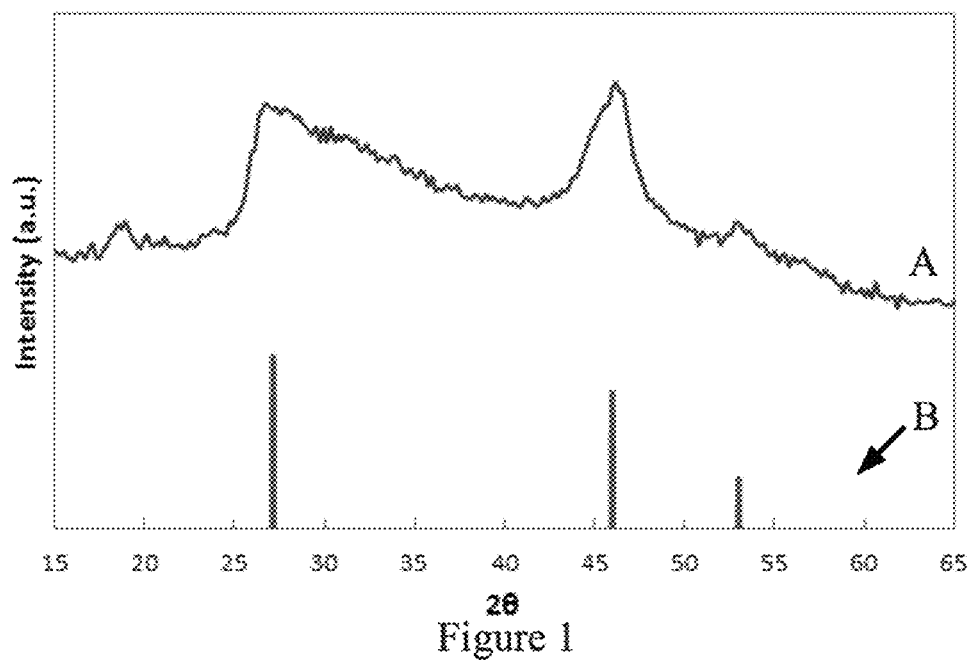
FIG. 1 shows the XRD pattern of indium selenide nanoscrolls synthesized in 1octadecene, showing broad peaks suggestive of nanoparticle materials. The peaks are compared to the cubic phase of InSe (K. H. Park et al., *J. Am. Chem. Soc.*, 2006, 128, 14780).

As stated above, the present disclosure provides methods for producing Group XIII selenide nanoparticles by reacting a source of Group XIII ions with a selenol compound. The nanoparticles have a semiconductor core of a material represented by the formula M$_x$Se$_y$, wherein M is Ga or In, 0<x, and 0<y. Nanoparticles can be prepared with a high degree of monodispersity, allowing for populations of nanoparticles having uniform properties. For example, the disclosed methods can be used to prepare populations of nanoparticles having a narrow melting point range. The nanoparticles can be as small as ~2 nm in diameter.

The selenol compound provides a source of selenium ions that are incorporated into the nanoparticle core. The selenol compound also provides an organic capping ligand. As a result, the nanoparticles have an organic functional group bound to the semiconductor core by a Se—C covalent bond. The organic functional group confers solubility and dispersibility of the nanoparticles in organic media. This renders the nanoparticles particularly suitable for use in inks and other formulations that can be used to deposit films of the nanoparticles onto substrates. Such inks can be used to fabricate printable solar cells on substrates, including flexible substrates. Once the nanoparticles are deposited, the organic group can be removed from the film at relatively a low temperature, enabling low temperature device sintering. The removal of the capping ligand by mild heating is virtually total and leaves no significant carbon residue on the particles after sintering, which enhances device performance.

The disclosed nanoparticles are particularly suitable as precursors for CIGS-type materials for use in photovoltaic devices. For example, the Group XIII selenide nanoparticles can be blended with CuSe nanoparticles and processed to form Cu(In,Ga)Se$_2$ thin films. The nanoparticles may be formulated into inks or pastes, which may then be deposited onto a substrate by a variety of techniques including printing (e.g., screen printing, ink jet printing, contact printing, gravure printing), or other methods, (e.g., simple doctor blade coating, spin coating, assisted aerosol spray coating, spray coating, but not restricted to such methods).

The selenol ligand of the disclosed nanoparticles can provide a selenium-rich atmosphere during sintering of films made using the disclosed nanoparticles. Thus, in some embodiments, it is not necessary to include an additional Se source during sintering. Moreover, an advantage of using a selenol compound as a capping ligand, instead of another class of compounds, such as thiols, is that the resulting nanoparticles and semiconductor films are not contaminated with non-selenium chalocogens, such as sulfur.

The Group XIII ion source, according to the disclosed methods, may be a Group XIII ion-coordination compound or a Group XIII salt. For example, the Group XIII ion source may be a metal chloride salt of a Group XIII element. Examples of ion-coordination compounds that may function as the Group XIII ion source include but are not limited to acetate (OAc) compounds and acetylacetonate (acac) compounds of Group XIII metals. Particular examples of Group XIII ion sources include $InCl_3$, $In(OAc)_3$, $In(acac)_3$, $GaCl_3$, $Ga(OAc)_3$, and $Ga(acac)_3$.

Generally, any selenol compound may be employed. Preferably, the selenol compound is a volatile organoselenol compound. Reference to an organic compound as being 'volatile' is well understood in the relevant technical field by the skilled person and generally refers to a compound that will vaporize at temperatures that are relatively low compared to other species with which the volatile compound is associated. In this way, using a volatile organoselenol compound provides the advantage of allowing the selenol to be easily and cheaply removed from the nanoparticles, for example by heating.

The organoselenol compound may be represented by the formula R—SeH, where R is a substituted or unsubstituted organic group. By substituted, it is meant that one or more hydrogen atoms bonded to a carbon atom may be replaced with a non-hydrogen atom. The organic group may be saturated or unsaturated. The organic group can be a linear, branched or cyclic organic group, which may be a carbocylic group or a heterocyclic group.

The organic group is preferably an alkyl, alkenyl, alkynyl, and/or aryl. The organic group may be an alkyl, alkenyl or alkynyl group containing 2 to 20 carbon atoms, more preferably 4 to 14 carbon atoms and most preferably 6 to 12 carbon atoms. An exemplary selenol compound is 1-octane selenol. A further exemplary selenol compound is 1dodecane selenol or 1-dodecylselenol. Alternatively, the organic group may be an aryl group containing 4 to 14 carbon atoms. More preferably the organic group is an aryl group containing 6 to 10 carbon atoms, still more preferably 6 to 8 carbon atoms.

At least a portion of the selenium ions in the nanoparticles may be provided by the selenol compound. Alternatively, or additionally, at least a portion of the selenium ions may be provided by an additional or secondary selenium source, such as, but not limited to trioctylphosphine (TOP) selenides.

To form nanoparticles, the Group XIII ion source is dispersed in a solvent. The choice of solvent is not limited to any particular solvent. It is generally preferred that the solvent have a higher boiling point (e.g., around 200° C. or higher) than the reaction temperature so as to provide a medium in which the reactants can decompose and react. The solvent is typically a non-coordinating organic solvent, for example a saturated or unsaturated long-chain hydrocarbon solvent. Exemplary solvents include long chain, e.g., $C_8$-$C_{24}$, alkanes or alkenes, such as octadecene ($C_{18}H_{36}$), which has a boiling point in excess of 250° C. Other suitable solvents include high-boiling heat transfer fluids, such as Therminol® 66, a modified terphenyl available from Solutia Inc., (St. Louis Mo.). According to some embodiments, a coordinating compound, such as a derivative of a fatty acid or a fatty amine, is used as a solvent, additive, or as a co-solvent to help solubilize the nanoparticles especially in organic solvents. Examples of such fatty acid and fatty amine derivatives are oleic acid and oleylamine, respectively. An example of a solvent mixture is a mixture of oleic acid and Therminol 66.

According to certain embodiments, the Group XIII ion source is dispersed in the solvent and the solvent is heated to a first temperature. For example, the first temperature may be around 50 to 150° C. According to some embodiments, the first temperature is around 100° C. The dispersion of Group XIII precursor may be degassed using an inert gas at the first temperature.

The selenol compound may be added to the dispersion at a second temperature or may be added at the first temperature. According to some embodiments, the temperature is dropped from the first temperature to a lower second temperature and the selenol compound is added to the dispersion. Following addition of the selenol compound, the temperature may be raised to a third temperature or the temperature may be maintained at the first or second temperatures. According to some embodiments, the third temperature is about 100 to about 160° C. Following addition of the selenol compound, the mixture may be maintained at the first, second, or third temperature for some period of time, ranging from several minutes to a few hours. For example, the mixture may be maintained for about 30 minutes to about 2 hours following addition of the selenol compound.

According to some embodiments, a secondary selenium source, such as TOP/Se is added to the reaction. Upon addition of the selenium compound, the temperature may be changed to a fourth temperature. The temperature may be ramped up or down, pausing at intermediate temperatures before reaching the fourth temperature. Generally, the mixture will be maintained at one or more temperatures between about 100° C. and about 220° C. for between about 30 minutes and about five hours following the addition of the selenium compound.

Nanoparticles can be isolated by precipitation and/or washing with a non-solvent, for example acetone or a mixture of toluene and acetone, followed by centrifugation or filtration. The preferred non-solvent depends upon the particular of reaction medium. The nanoparticles may be subjected to multiple washing steps. The disclosed methods can be further understood in view of the following examples.

Example 1: Synthesis of Indium Selenide Nanoparticles in 1-Octadecene

A flask was charged with indium acetate $In(OAc)_3$ (2 g, 6.85 mmol) and 1octadecene (10 mL), degassed for 60 minutes at 100° C., and then backfilled with $N_2$. The mixture was cooled to 75° C. and 1-octane selenol (4 mL, 22.4 mmol) was added quickly. The mixture was heated to 140° C., giving a cloudy dark red/orange solution. TOP/Se (6.25 mL of 1.71 M, 10.7 mmol) was injected into the flask at 12.5 mL hr$^{-1}$. Once the addition was complete, the temperature was raised to 160° C. for 1 hour. The mixture was cooled to 140° C. for 30 minutes and then cooled to room temperature. The solid was isolated by washing with methanol, then acetone, followed by centrifugation. The supernatant was discarded, and the brown solid was retained as the product.

Figure 3:
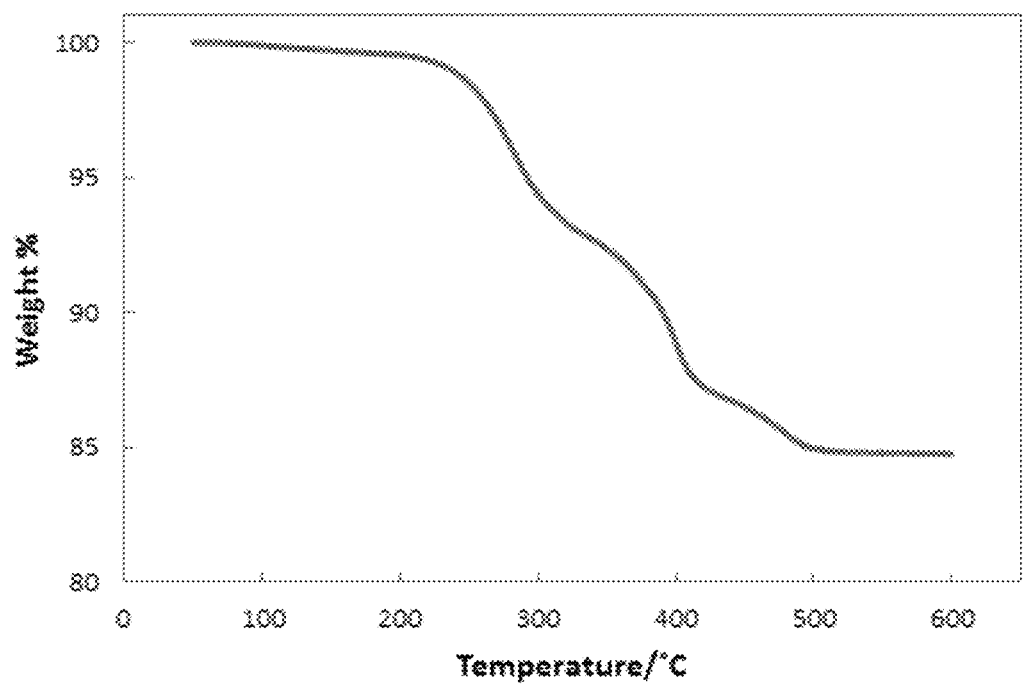
FIG. 3 shows a thermogravimetric analysis (TGA) graph of indium selenide nanoparticles synthesized in 1-octadecene.
Figure 2:
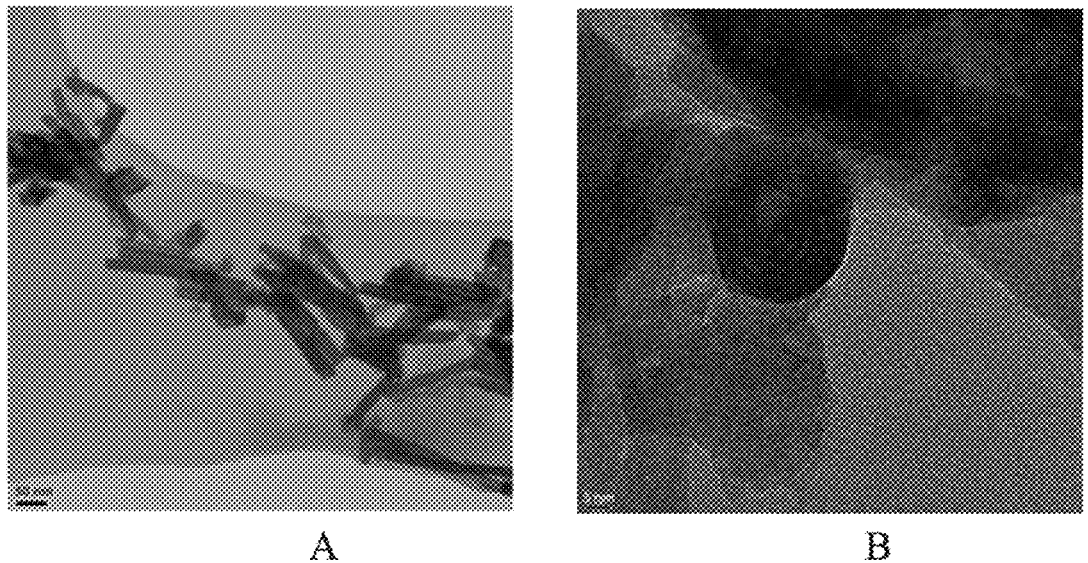
FIG. 2 shows TEM images of indium selenide nanoparticles synthesized in 1octadecene.
Figure 4:
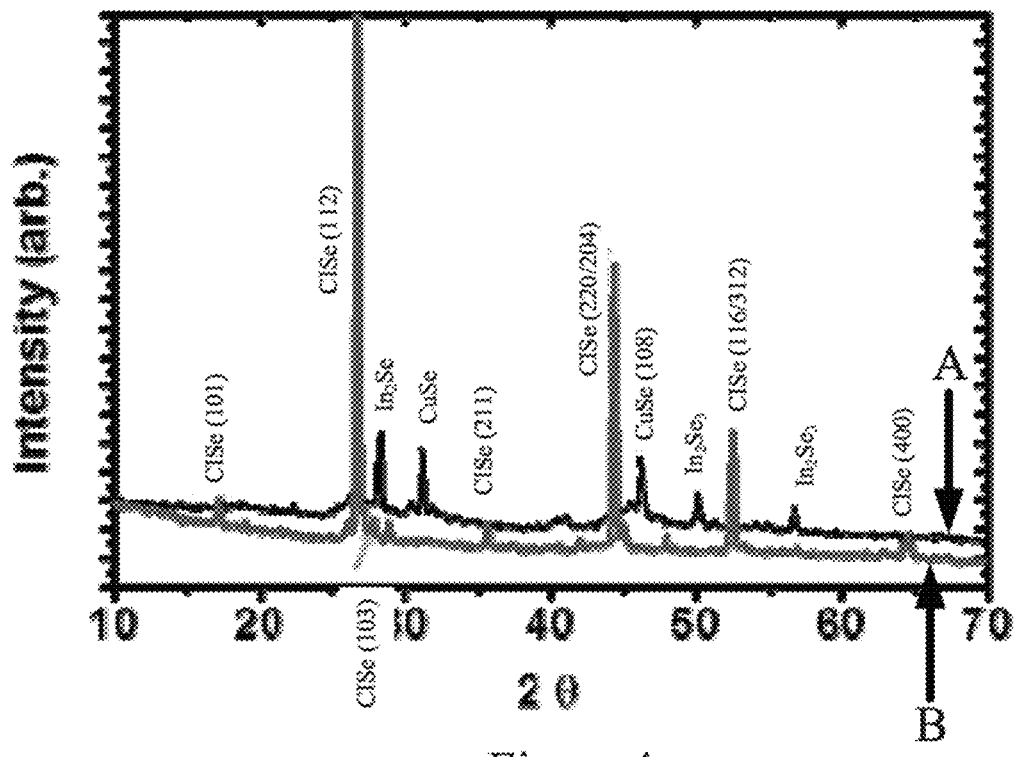
FIG. 4 shows the XRD pattern of an indium selenide nanoparticle film annealed at 500° C. after deposition under nitrogen (black trace) and in the presence of CuSe nanoparticles at 500° C. under a selenium atmosphere (red trace). Annealing in the presence of CuSe nanoparticles enables the conversion to tetragonal phase CuInSe$_2$.

Elemental analysis for the product indicates: C 9.87%; H 1.53%; In 42.6%; Se 39.9%. The elemental ratio determined by chemical analysis corresponds to a material with formula InSe$_{1.36}$. The 1-octane selenol ligand present on the particle surface contributes to the total amount of selenium found in the material. Referring to FIG. 1, the XRD pattern of the material (A) is characterized by broad diffraction peaks typical of nanoparticles. The peaks are matched to the cubic phase of InSe (B) (K. H. Park et al., *J. Am. Chem. Soc.,* 2006, 128, 14780). TEM analysis, shown in FIG. 2, shows that the material is made of nanoscrolls, i.e. nanosheets that have scrolled into nanotubes, with an average length of 200 nm (best seen in FIG. 2A) and an average thickness of 40 nm (best seen in FIG. 2B). This phenomenon has been reported in other layered materials, such as sodium titanate ('Formation, Structure, and Stability of Titanate Nanotubes and Their Proton Conductivity', A. Thorne et al., *J. Phys. Chem. B,* 2005, 109, 5439). TGA performed under nitrogen indicates that the material contains approximately 15% w/w of volatile organic ligands that are completely removed when the temperature reaches 500° C. (FIG. 3). The organic ligands help to disperse the nanoparticles in a range of solvents and can be removed by conventional, low temperature baking processes. FIG. 4A shows XRD of the InSe nanoparticles co-deposited with CuSe nanoparticles after annealing at 500° C. under N2.

Figure 5:
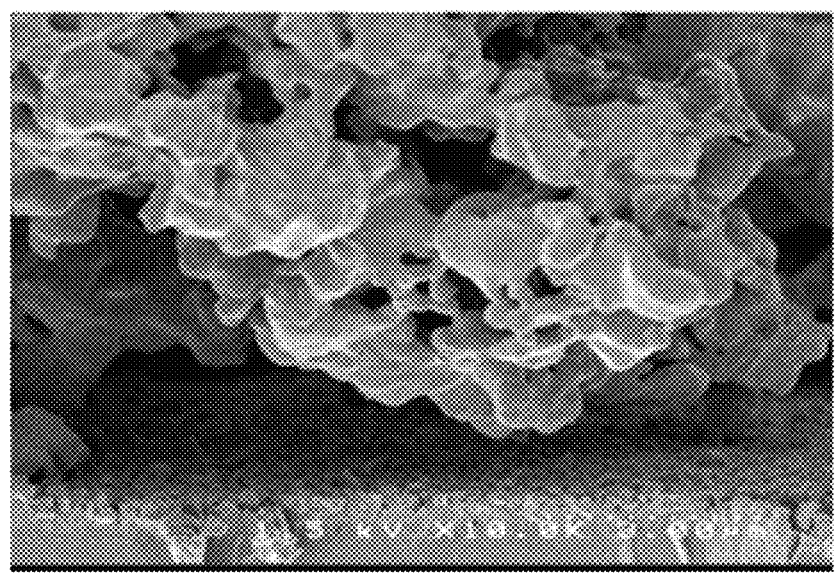
FIG. 5 shows a scanning electron microscopy (SEM) image showing large grains of copper indium diselenide, formed by annealing a blend of indium selenide and copper selenide in a selenium-rich atmosphere.
Figure 6:
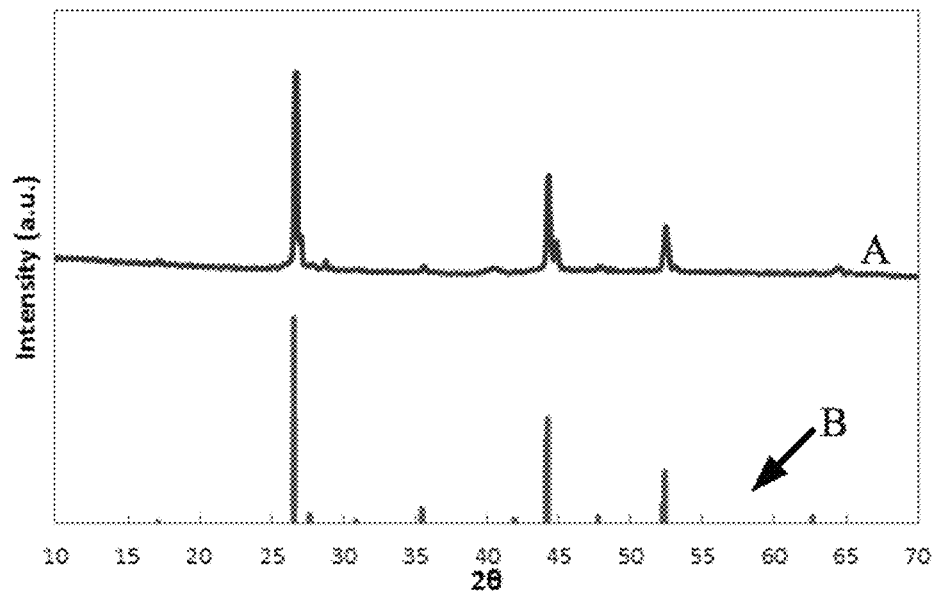
FIG. 6 shows the XRD pattern of a copper indium diselenide film. The film was produced by rapid thermal annealing of a film of blended indium selenide and copper selenide nanoparticles, on a glass substrate, on a preheated hotplate under dry N$_2$. The reflections match the peak positions of chalcopyrite CuInSe$_2$ from the JCPDS database (00040-1487).

Baking at 500° C. in the presence of CuSe nanoparticulate material in a selenium-rich atmosphere converts the co-deposited nanoparticles to the tetragonal phase of $CuInSe_2$ (FIG. 4B). Annealing in a selenium-rich atmosphere produces large grains, as observed using scanning electron microscopy (FIG. 5). Alternatively, a rapid thermal annealing process in an $N_2$ atmosphere yields a tetragonal phase film of $CuInSe_2$. FIG. 6A is an XRD pattern of a copper indium diselenide film produced by rapid thermal annealing of a film of blended indium selenide and copper selenide nanoparticles on a glass substrate on a preheated hotplate under dry $N_2$. The reflections match the peak positions of chalcopyrite $CuInSe_2$ from the JCPDS database (00-040-1487) (FIG. 6B).

Example 2: Synthesis of Indium Selenide Nanoparticles in Oleic Acid/Therminol 66

$In(OAc)_3$ (2.921 g, 10.00 mmol), 18 mL of oleic acid and 18 mL of Therminol 66 were degassed for 90 minutes at 100° C. then backfilled with $N_2$ and cooled to 45° C. 1-Octane selenol (9 mL, 50.5 mmol) was added quickly, upon which a white mass formed and the stirring became inhibited. The mixture was heated to 100° C. and the white solid melted. The temperature was reduced to 75° C., forming a cloudy, pale yellow solution.

Separately, Se powder (1.244 g, 15.75 mmol) was dissolved in TOP (9.25 mL) under $N_2$. The TOP/Se was added to the reaction solution and stirred for 30 minutes at 75° C. The solution was heated to 100° C. and held for 75 minutes, forming an orange precipitate in a clear solution. The mixture was allowed to cool to room temperature. The solid was isolated by washing with acetone, then toluene/acetone, followed by centrifugation. The supernatant was discarded, and the orange powder was retained as the product. Elemental analysis for the product indicates: C 24.45%; H 4.17%; In 30.74%; Se 38.69%. The elemental ratio determined by chemical analysis corresponds to a material with formula $InSe_{1.83}$. The 1-octane selenol ligand present on the particle surface contributes to the total amount of selenium found in the material.

Figure 7:
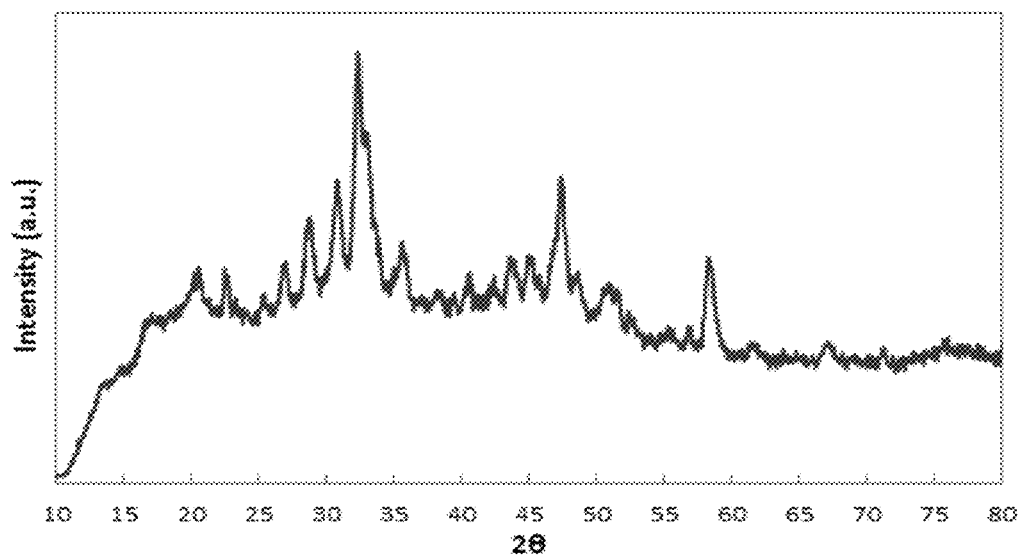
FIG. 7 shows the XRD pattern of indium selenide nanoparticles synthesized in oleic acid/Therminol® 66.
Figure 9:
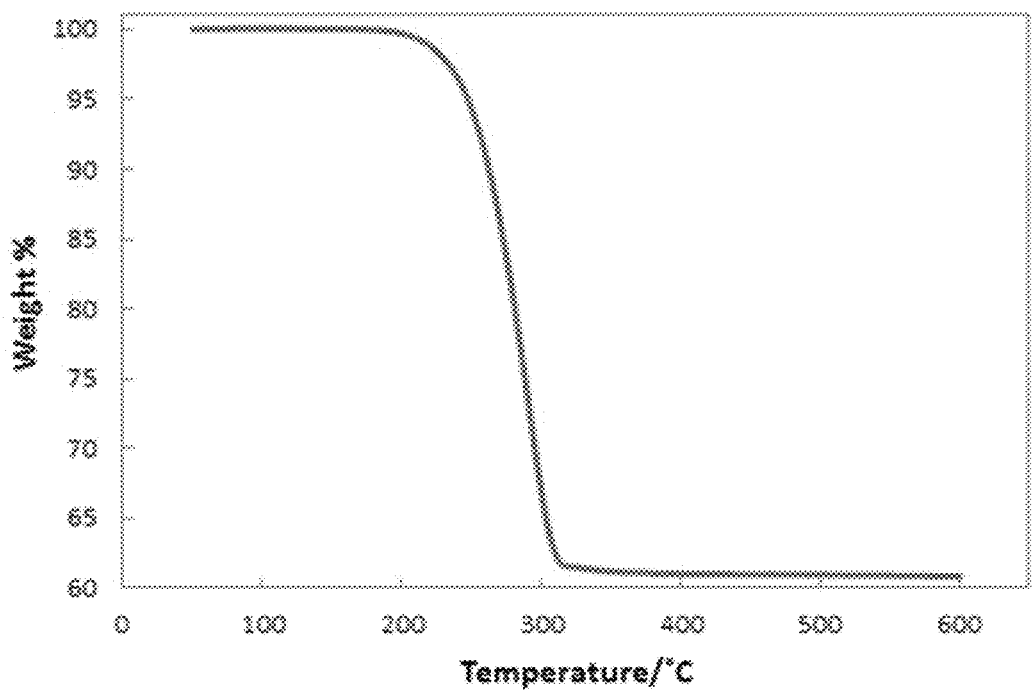
FIG. 9 shows TGA of indium selenide nanoparticles synthesized in oleic acid/Therminol 66.
Figure 8:
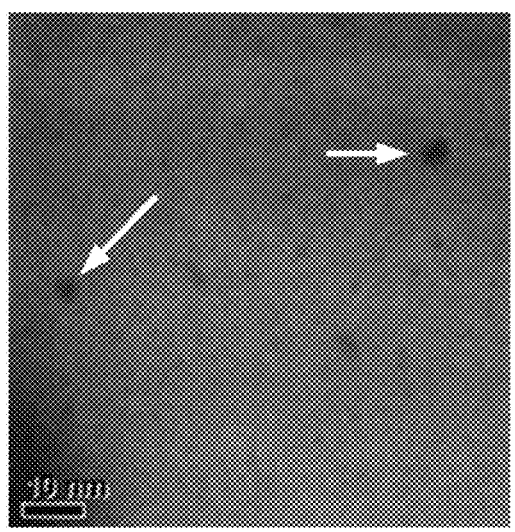
FIG. 8 shows a TEM image of indium selenide nanoparticles synthesized in oleic acid/Therminol 66. The spherical particles are between 3-5 nm in diameter.

The XRD pattern of the material is characterized by fairly broad diffraction peaks that are typical of nanoparticles (FIG. 7). TEM analysis shows that the nanoparticles are spherical and are between 3-5 nm in diameter (FIG. 8). TGA performed under nitrogen indicates that the material contains approximately 39% w/w of volatile organic ligands that are completely removed when the temperature reaches 350° C. (FIG. 9).

Example 3: Synthesis of Indium Selenide Nanoparticles in Oleylamine $In(OAc)_3$ (2.000 g, 6.85 mmol) and oleylamine (10 mL) were degassed for 1 hour at 100° C.; then the flask was backfilled with nitrogen. 1-Octane selenol (4 mL, 22.4 mmol) was added quickly at 75° C., then the mixture was heated to 140° C. TOP/Se solution (6.25 mL, 1.71 M, 10.7 mmol) was added at a rate of 12.5 mL h$^{-1}$. Once the addition was complete the temperature was raised to 160° C. and held for 2 hours. The solution was cooled to 120° C. and held for 4 hours and then allowed to cool to room temperature.

The solid was isolated by washing with methanol, then toluene/methanol, followed by centrifugation. The supernatant was discarded, and the dark brown solid/paste was retained as the product. Elemental analysis for the product indicates: C 28.08%; H 4.95%; N 1.25%; In 30.18%; Se 31.38%. The elemental ratio determined by chemical analysis corresponds to a material with formula $InSet_{1.51}$. The 1-octane selenol ligand present on the particle surface contributes to the total amount of selenium found in the material.

Figure 11:
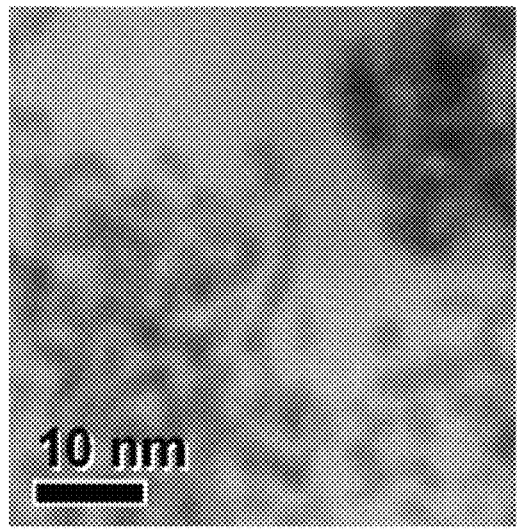
FIG. 11 shows a TEM image of indium selenide nanoparticles synthesized in oleylamine. The spherical nanoparticles are between 2-3 nm in diameter.
Figure 10:
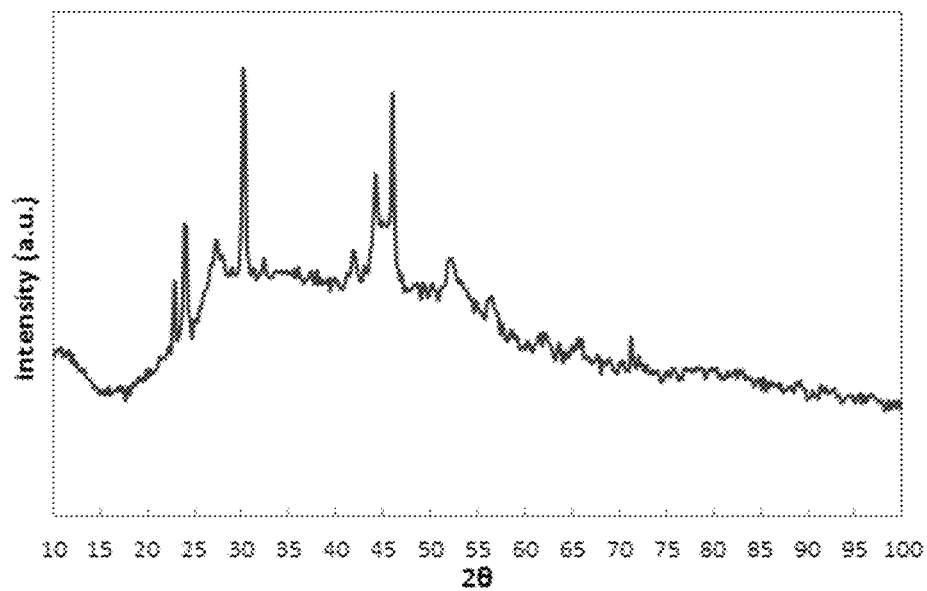
FIG. 10 shows the XRD pattern of indium selenide nanoparticles synthesized in oleylamine.
Figure 12:
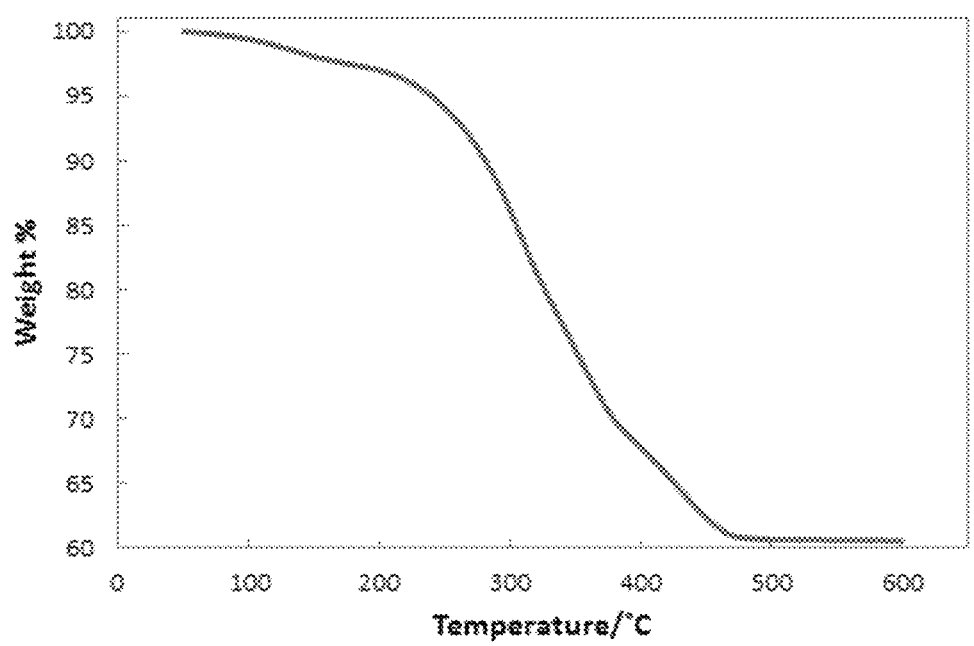
FIG. 12 shows TGA of indium selenide nanoparticles synthesized in oleylamine.

The XRD pattern of the material is characterized by diffraction peaks that are typical of aggregated nanoparticles (FIG. 10). TEM analysis shows that the material is made of spherical nanoparticles between 2-3 nm in diameter (FIG. 11). TGA performed under nitrogen indicates that the material contains approximately 39% w/w of volatile organic ligands that are completely removed when the temperature reaches 500° C. (FIG. 12).

Example 4: Synthesis of Gallium Selenide Nanoparticles in Oleic Acid/Therminol 66

$Ga(acac)_3$ (2.00 g, 5.45 mmol), Therminol 66 (10 mL) and oleic acid (10 mL) were degassed for 1 hour at 100° C. and then the flask was backfilled with $N_2$ and cooled to room temperature. 1-Octane selenol (5 mL, 28.1 mmol) was added quickly and the clear yellow solution was left to stir at room temperature for 30 minutes. TOP/Se (5.1 mL, 1.71 M, 8.7 mmol) was injected quickly and the solution was stirred at room temperature for 30 minutes. The solution was heated to 100° C. and held for 30 minutes, then stirred at 125° C. for 30 minutes, then heated to 140° C. and stirred for 60 minutes. The solution was cooled to 100° C. and left to anneal for 4 hours, before cooling to room temperature.

The solid was isolated by washing with methanol, then isopropanol, then dichloromethane/methanol, followed by centrifugation. The supernatant was discarded, and the yellow/cream colored sticky solid was retained as the product. Elemental analysis for the product indicates: C 30.93%; H 5.30%; Ga 19.70%; Se 42.55%. The elemental ratio determined by chemical analysis corresponds to a material with formula $GaSe_{1.91}$. The 1octane selenol ligand present on the particle surface contributes to the total amount of selenium found in the material.

Figure 13:
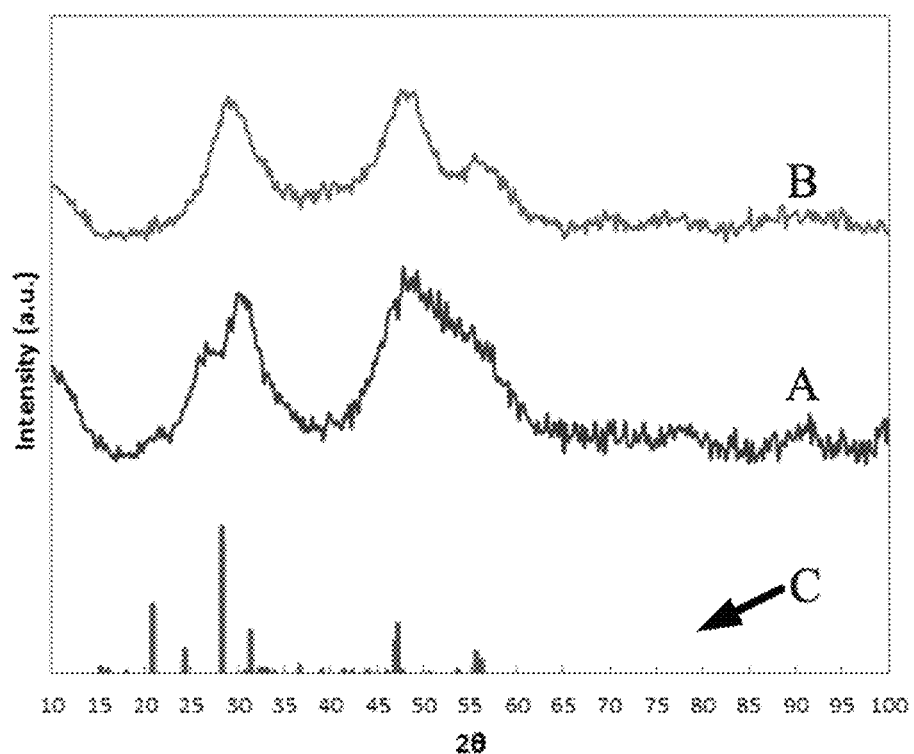
FIG. 13 shows the XRD pattern of gallium selenide nanoparticles synthesized in oleic acid/Therminol 66. The plot shows the as-synthesized material along with a film that was annealed under N$_2$ for 10 minutes at 260° C. The reflections match the peak positions of monoclinic Ga$_2$Se$_3$ from the JCPDS database (00-044-0931).
Figure 14:
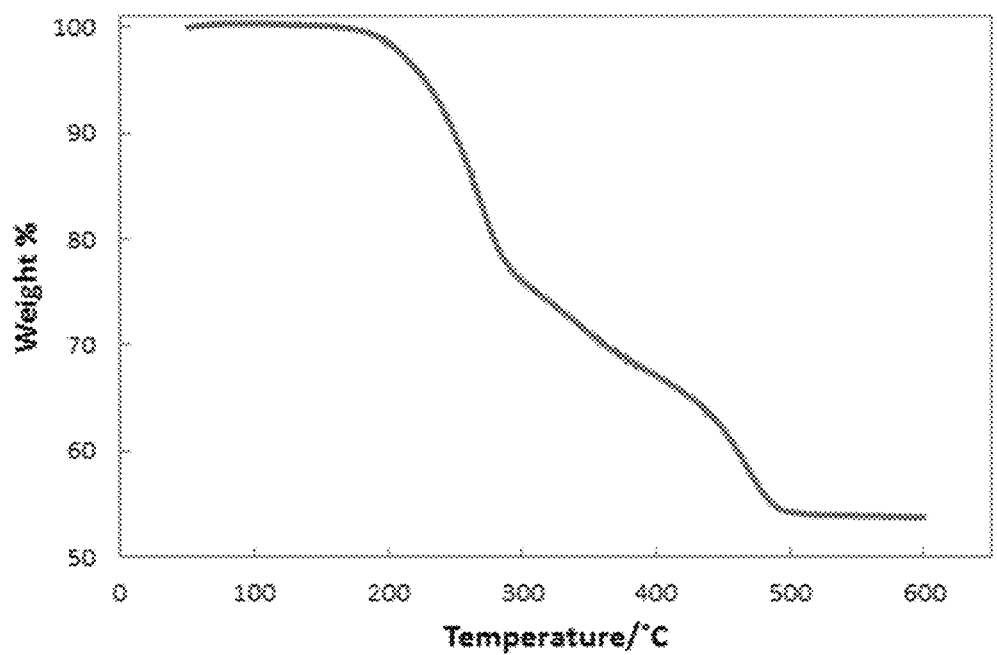
FIG. 14 shows TGA of gallium selenide nanoparticles.

The XRD pattern of the material is characterized by broad diffraction peaks that are typical of very small nanoparticles FIG. 13 (A). The XRD pattern of an annealed film of the nanoparticles, heated at 260° C. for 10 minutes under $N_2$ shows better defined peaks (B) with peak positions matching those of monoclinic $Ga_2Se_3$ from the JCPDS database (00044-0931) (C). TGA analysis performed under nitrogen indicates that the material contains approximately 46% w/w of volatile organic ligands that are completely removed at around 500° C. (FIG. 14).

Example 5: Synthesis of Gallium Selenide Nanoparticles in 1Octadecene/Oleylamine $Ga(acac)_3$ (2.30 g, 6.27 mmol), 1-octadecene (10 mL) and oleylamine (5 mL) were degassed for 1 hour at 100° C. and then the flask was backfilled with $N_2$ and cooled to 70° C. 1-Dodecane selenol (5.6 mL) was added quickly and the solution was heated to 140° C. TOP/Se (5.8 mL, 1.71 M, 9.9 mmol) was injected at a rate of 1 mL min$^{-1}$. The solution was heated to 220° C.; once the temperature reached 180-200° C., a colourless liquid was distilled off. The solution was held at 220° C. for 30 minutes, then cooled to room temperature.

The solid was isolated by washing with isopropanol, then dichloromethane/isopropanol, followed by centrifugation. The supernatant was discarded, and the dark yellow solid (1.0 g) was retained as the product. The product dissolved readily in toluene. Elemental analysis for the product indicates: C 30.15%; H 4.89%; N 1.45%; Ga 23.06%; Se 39.85%. The elemental ratio determined by chemical analysis corresponds to a material with formula $GaSe_{1.53}$. The 1-dodecane selenol ligand present on the particle surface contributes to the total amount of selenium found in the material.

Figure 18:
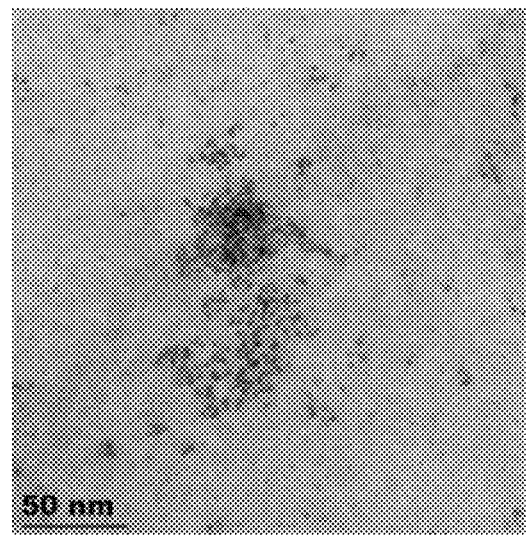
FIG. 18 is a transmission electron microscopy (TEM) image of gallium selenide nanoparticles, on the order of ~5 nm in diameter and with a spherical morphology
Figure 15:
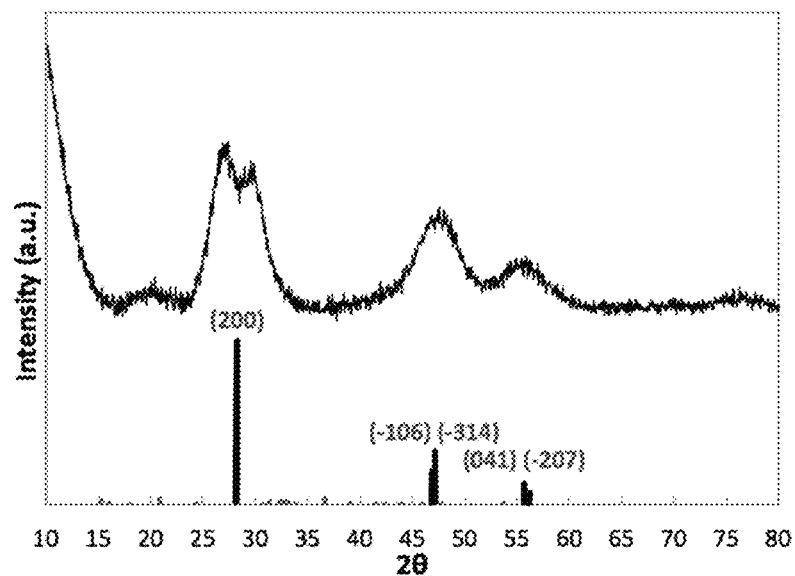
FIG. 15 shows the X-ray diffraction (XRD) pattern of gallium selenide nanoparticles synthesized in 1-octadecene/oleylamine. The higher angle reflections match the peak positions of monoclinic (β-phase) Ga$_2$Se$_3$ from the JCPDS database (00-044-0931). Apparent splitting of the (200) peak suggests the as-synthesised material is crystallized in a lower order symmetry, pseudo-βphase.
Figure 16:
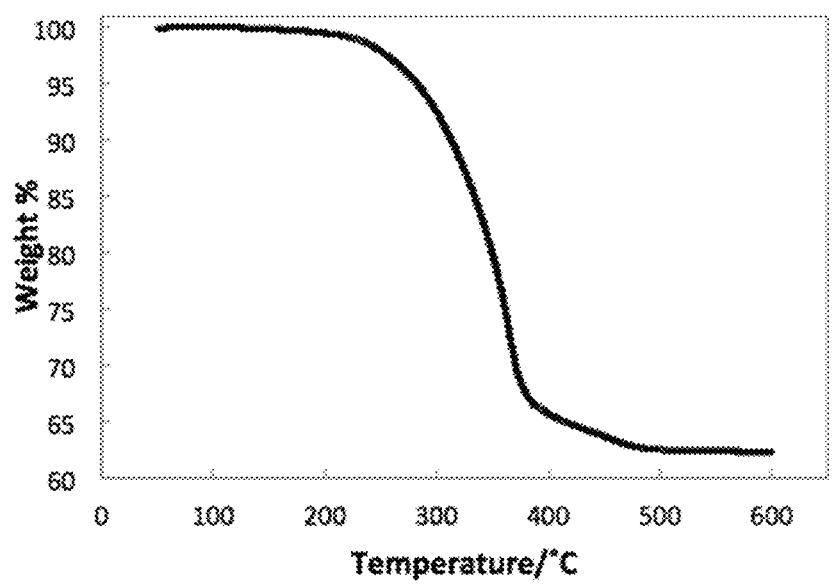
FIG. 16 shows the thermogravimetric analysis (TGA) of gallium selenide nanoparticles.
Figure 17:
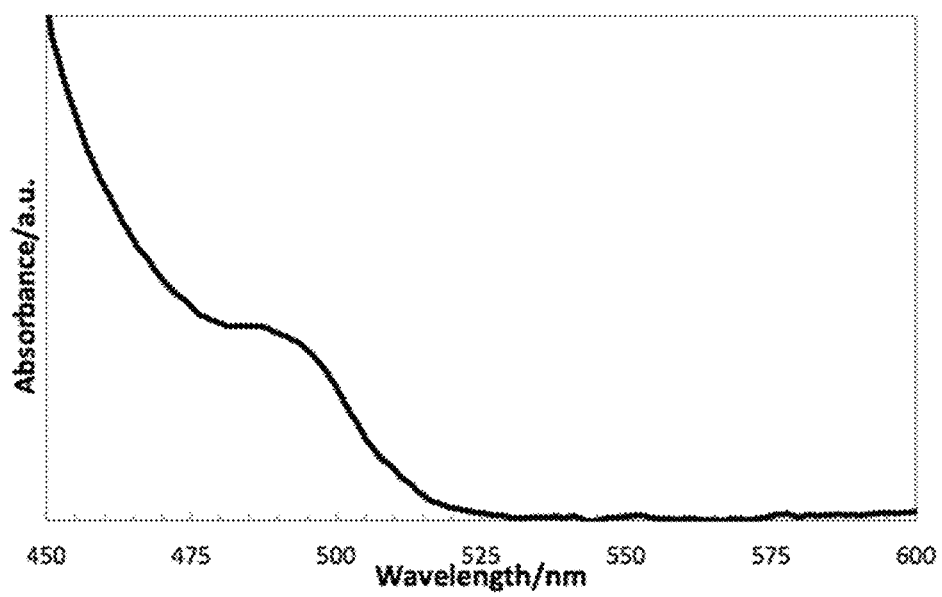
FIG. 17 shows the UV-visible absorption spectrum of gallium selenide, with a peak at around 495 nm (2.5 eV).

The X-ray diffraction (XRD) pattern of the material is characterized by broad diffraction peaks that are typical of small nanoparticles (FIG. 15). The higher angle reflections match the peak positions of monoclinic (β-phase) $Ga_2Se_3$ from the JCPDS database (00-044-0931). Apparent splitting of the (200) peak suggests the material is crystallized in a lower order symmetry, pseudo-β phase. TGA analysis performed under nitrogen indicates that the material contains approximately 62% w/w of volatile organic ligands that are completely removed at around 500° C. (FIG. 16). The UV-visible absorption spectrum (FIG. 17) shows an absorption peak around 495 nm (2.5 eV). The relative blue-shift in the absorption peak wavelength with respect to the bulk band gap of $Ga_2Se_3$ (2.3 eV≈539 nm for the β phase) is suggestive of quantum confinement effects in the nanoparticle material. Transmission electron microscopy (TEM, FIG. 18) reveals that the nanoparticles are relatively monodisperse, with an approximately spherical morphology and an average nanoparticle diameter on the order of ~5 nm.

Example 6: Larger Scale Synthesis of Gallium Selenide Nanoparticles in 1Octadecene/Oleylamine $Ga(acac)_3$ (11.50 g, 31.33 mmol), 1-octadecene (50 mL) and oleylamine (25 mL) were degassed for 1 hour at 100° C. and then the flask was backfilled with $N_2$ and cooled to 70° C. 1-Dodecane selenol (28.0 mL) was added quickly and the solution was heated to 140° C. TOP/Se (29.0 mL, 1.71 M, 49.6 mmol) was injected at a rate of 1 mL $min^{-1}$. The solution was heated to 220° C. and held for 30 minutes. The solution was cooled to room temperature.

The solid was isolated by washing with isopropanol, then dichloromethane/isopropanol, followed by centrifugation. The supernatant was discarded, and the yellow solid (6.9 g) was retained as the product. Characterization date were comparable to those of the smaller scale reaction in Example 5.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A method of forming a semiconductor film, the method comprising:
    co-depositing CuSe nanoparticles and Group 13 selenide nanoparticles on a substrate; and,
    heating the substrate to a temperature sufficient to melt the CuSe nanoparticles and the Group 13 selenide nanoparticles;
    wherein the Group 13 selenide nanoparticles comprise a Group 13 selenide semiconductor having the formula $M_xSe_y$, wherein M is Ga or In, 0<x, and 0<y and an organic capping ligand bound to the nanoparticle by a carbon-selenium covalent bond and,
    wherein the temperature is sufficient to remove the organic capping ligand.

2. The method of claim 1 wherein the organic capping ligand is an alkyl, alkenyl, alkynyl, or aryl group.

3. The method of claim 1 wherein the semiconductor film is free of sulfur.

4. The method of claim 1 wherein the Group 13 selenide nanoparticles are prepared by a method comprising:
    reacting a Group 13 ion precursor with a selenol compound.

5. The method of claim 4 wherein the Group 13 ion precursor is a chloride, acetate, or acetylacetonate of a Group 13 element.

6. The method of claim 4 wherein the Group 13 ion precursor is selected from the group consisting of $InCl_3$, $In(OAc)_3$, $In(acac)_3$, $GaCl_3$, $Ga(OAc)_3$ and $Ga(acac)_3$.

7. The method of claim 4 wherein the selenol compound is an alkyl, alkenyl, alkynyl, or aryl selenol.

8. The method of claim 4 wherein the selenol compound contains 4 to 14 carbon atoms.

9. The method of claim 4 wherein the selenol compound is octane selenol.

10. The method of claim 4 further comprising adding a second selenium compound to the Group 13 ion precursor.

11. The method of claim 10 wherein the second selenium compound is a trioctylphosphine selenide.

12. The method of claim 4 wherein the selenide nanoparticles have diameters less than about 200 nm.

13. The method of claim 4 wherein the selenide nanoparticles have diameters of about 2 to about 100 nm.

14. The method of claim 4 wherein the selenide nanoparticles have diameters less than about 10 nm.

* * * * *